(12) United States Patent
Fiolka et al.

(10) Patent No.: US 8,730,455 B2
(45) Date of Patent: May 20, 2014

(54) ILLUMINATION SYSTEM FOR A MICROLITHOGRAPHIC PROJECTION EXPOSURE APPARATUS

(75) Inventors: Damian Fiolka, Oberkochen (DE); Manfred Maul, Aalen (DE); Axel Scholz, Aalen (DE); Markus Deguenther, Aalen (DE); Johannes Wangler, Koenigsbronn (DE); Vladimir Davydenko, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 400 days.

(21) Appl. No.: 13/181,033

(22) Filed: Jul. 12, 2011

(65) Prior Publication Data

US 2011/0285978 A1 Nov. 24, 2011

Related U.S. Application Data

(60) Division of application No. 11/505,408, filed on Aug. 17, 2006, now Pat. No. 8,004,656, which is a continuation-in-part of application No. PCT/EP2005/001501, filed on Feb. 15, 2005.

(60) Provisional application No. 60/545,105, filed on Feb. 17, 2004.

(51) Int. Cl.
  *G03B 27/54* (2006.01)
  *G03B 27/72* (2006.01)
  *G03F 7/20* (2006.01)
  *G03B 27/68* (2006.01)
  *G03B 27/42* (2006.01)
  *G03B 27/52* (2006.01)

(52) U.S. Cl.
  CPC .......... *G03F 7/7015* (2013.01); *G03F 7/70075* (2013.01)

USPC ................ 355/67; 355/52; 355/53; 355/55; 355/71

(58) Field of Classification Search
  CPC ............. G03F 7/7058; G03F 7/70075; G03F 7/70191; G03F 7/7015; G03F 7/70108; G03B 27/54
  USPC ............... 355/52, 53, 55, 67–71; 250/492.1, 250/492.2, 492.22, 548; 359/619, 621–624
  See application file for complete search history.

(56) References Cited

U.S. PATENT DOCUMENTS

| 3,802,762 A | 4/1974 | Kiemle |
| 4,132,479 A | 1/1979 | Dubroeucq et al. |

(Continued)

FOREIGN PATENT DOCUMENTS

| EP | 0 952 491 A2 | 10/1999 |
| EP | 1 020 769 A2 | 7/2000 |

(Continued)

*Primary Examiner* — Toan Ton
*Assistant Examiner* — Christina Riddle
(74) *Attorney, Agent, or Firm* — Sughrue Mion, PLLC

(57) ABSTRACT

An illumination system for a microlithographic projection exposure step-and-scan apparatus has a light source, a first optical raster element and a second optical raster element. The first optical raster element extends in a first pupil plane of the illumination system and is designed such that the geometrical optical flux of the system is increased perpendicular to a scan direction of the projection exposure apparatus. The second optical raster element extends in a second pupil plane of the illumination system, which is not necessarily different from the first pupil plane, and is designed such that the geometrical optical flux of the system is increased in the scan direction and perpendicular thereto. This makes it possible to improve the irradiance uniformity in a reticle plane.

10 Claims, 15 Drawing Sheets

(56) References Cited

U.S. PATENT DOCUMENTS

| | | | |
|---|---|---|---|
| 4,497,015 A * | 1/1985 | Konno et al. | 362/268 |
| 4,682,885 A | 7/1987 | Torigoe | |
| 4,733,944 A | 3/1988 | Fahlen et al. | |
| 4,988,188 A | 1/1991 | Ohta | |
| 5,555,479 A | 9/1996 | Nakagiri | |
| 5,844,727 A | 12/1998 | Partlo | |
| 5,847,746 A | 12/1998 | Takahashi | |
| 5,963,305 A | 10/1999 | Mizouchi | |
| 6,243,206 B1 | 6/2001 | Wangler | |
| 6,285,443 B1 | 9/2001 | Wangler et al. | |
| 6,307,682 B1 | 10/2001 | Hoffman et al. | |
| 6,404,499 B1 | 6/2002 | Stoeldraijer et al. | |
| 6,497,488 B1 | 12/2002 | Yamauchi et al. | |
| 6,583,937 B1 | 6/2003 | Wangler et al. | |
| 6,643,300 B1 | 11/2003 | Ori | |
| 6,836,365 B2 | 12/2004 | Goto | |
| 6,913,373 B2 * | 7/2005 | Tanaka et al. | 362/268 |
| 6,967,710 B2 | 11/2005 | Shiraishi | |
| 7,158,237 B2 | 1/2007 | Schriever et al. | |
| 7,242,457 B2 | 7/2007 | Shinoda | |
| 7,379,160 B2 | 5/2008 | Toyoda | |
| 2001/0012138 A1 | 8/2001 | Sugitatsu et al. | |
| 2003/0016447 A1 | 1/2003 | Kato et al. | |
| 2003/0043356 A1 | 3/2003 | Shiraishi | |
| 2003/0197906 A1 | 10/2003 | Furuta et al. | |
| 2004/0036977 A1 | 2/2004 | Tanaka et al. | |
| 2004/0120037 A1 | 6/2004 | Chang et al. | |
| 2005/0231702 A1 * | 10/2005 | Shinoda | 355/67 |
| 2006/0055905 A1 | 3/2006 | Baselmans et al. | |
| 2006/0268251 A1 | 11/2006 | Deguenther et al. | |
| 2007/0253058 A1 | 11/2007 | Wood | |
| 2008/0237489 A1 * | 10/2008 | Hirono | 250/492.1 |
| 2009/0021839 A1 * | 1/2009 | Wolf et al. | 359/621 |

FOREIGN PATENT DOCUMENTS

| | | |
|---|---|---|
| EP | 1 180 726 A | 2/2002 |
| EP | 1 367 442 A | 12/2003 |
| JP | 2001515268 A | 9/2001 |
| JP | 2003315521 A | 11/2003 |
| JP | 2004045885 A | 2/2004 |
| WO | 03-087945 A2 | 10/2003 |
| WO | WO 2005/015310 A2 | 2/2005 |
| WO | WO 2005/078522 A2 | 8/2005 |

* cited by examiner

ILLUMINATION SYSTEM FOR A MICROLITHOGRAPHIC PROJECTION EXPOSURE APPARATUS

CROSS-REFERENCE TO RELATED APPLICATIONS

This is a Divisional of U.S. application Ser. No. 11/505,408 filed Aug. 17, 2006 now U.S. Pat. No. 8,004,656, which is a continuation-in-part of international application PCT/EP2005/001501 filed Feb. 15, 2005 and claiming benefit of U.S. provisional application 60/545,105, which was filed Feb. 17, 2004. The full disclosure of these earlier applications is incorporated herein by reference.

BACKGROUND OF THE INVENTION

1. Field of the Invention

The invention relates generally to illumination systems for microlithographic projection exposure apparatus. More particularly, the invention relates to illumination systems comprising an optical field defining component that is positioned in or in close proximity to a pupil plane of the illumination system. Such a field defining component determines, together with stops, the geometry and the intensity distribution of a field that is illuminated by the illumination system on a reticle to be projected.

2. Description of Related Art

Microlithography (also called photolithography) is a technology for the fabrication of integrated circuits, liquid crystal displays and other microstructured devices. More particularly, the process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, the wafer with the photoresist on top is exposed to illumination light through a reticle (also referred to as a mask) in a projection exposure apparatus, such as a step-and-scan tool. The reticle contains a circuit pattern to be projected onto the photoresist. After exposure the photoresist is developed to produce an image corresponding to the circuit pattern contained in the reticle. Then an etch process transfers the circuit pattern into the thin film stacks on the wafer. Finally, the photoresist is removed.

A projection exposure apparatus typically includes an illumination system, a projection lens, a reticle alignment stage and a wafer alignment stage for aligning the reticle and the wafer, respectively. The illumination system illuminates a region of the reticle that may have the shape of an elongated rectangular slit. As the technology for manufacturing microstructured devices advances, there are ever increasing demands also on the illumination system. For example, there is a need to illuminate the illuminated field on the reticle with a very uniform irradiance.

Another important property of illumination systems is the ability to manipulate the angular distribution of the illumination light bundle that is directed onto the reticle. In more sophisticated illumination systems it is possible to adapt the angular distribution of the illumination light to the kind of pattern to be projected onto the reticle. For example, relatively large sized features may require a different angular distribution than small sized features. The most commonly used angular distributions of illumination light are referred to as conventional, annular, dipole and quadrupole illumination settings. These terms refer to the intensity distribution in a pupil plane of the illumination system. With an annular illumination setting, for example, only an annular region is illuminated in the pupil plane, and thus there is only a small range of angles present in the angular distribution of the illumination light so that all light beams impinge obliquely with similar angles onto the reticle.

Since lasers are typically used as light sources in illumination systems, the illumination light bundle emitted by the light source has usually a small cross section and a low divergence. Therefore the geometrical optical flux, which is also referred to as the light conductance value, the Etendu-invariant or Lagrange-invariant, is small. Since the geometrical optical flux is not altered when a light bundle traverses an interface between media having different refractive indices, the geometrical optical flux cannot be changed by conventional refractive optical elements such as lenses.

Therefore most illumination systems contain optical elements that integrally increase the divergence of light passing the element. Optical elements having this property will in the following be generally referred to as optical raster elements. Such raster elements comprise a plurality of—usually periodically arranged—substructures, for example diffraction structures or microlenses.

From U.S. Pat. No. 6,285,443 an illumination system is known in which a first optical raster element is positioned in an object plane of an objective within the illumination system. A field defining component formed as a second optical raster element is positioned in an exit pupil plane of the objective. As a result of this arrangement, the first optical raster element determines the intensity distribution in the exit pupil plane and therefore modifies the angular distribution of light. At the same time the geometrical optical flux of the illumination light is increased. The field defining component modifies the size and geometry of the illuminated field on the reticle and also increases the geometrical optical flux of the illumination light bundle. Zoom optics and a pair of axicon elements allow to modify the intensity distribution in the pupil plane and therefore the angular distribution of the illumination light bundle.

Conventional illumination systems often comprise a glass rod or another light mixing element that generates a uniform irradiance in the reticle plane. However, it is difficult to preserve the polarization state of the illumination light with such light mixing elements. This is disadvantageous because it has been found out that illuminating the reticle with illumination light having a carefully selected polarization state may considerably improve the imaging of the reticle onto the photoresist.

For that reason illumination systems are designed that do not comprise light mixing elements such as glass rods. However, this requires that other means are found for achieving the desired uniform irradiance in the reticle plane. In step-and-scan tools in which the reticle is moved synchronously with the wafer during the projection, uniform irradiance in the direction perpendicular to the scan direction is of particular concern since the irradiance is not averaged by time integration as is the case in the scan direction.

One approach to solve this problem is to use an adjustable stop device as is disclosed in European patent application EP 0 952 491 A2. This device comprises two opposing rows of little adjacent blades that are arranged parallel to the scan direction. Each blade can be selectively inserted into the illumination light bundle. By adjusting the distance between the blades, the irradiance on the reticle can be manipulated in the direction perpendicular to the scan direction. However, is has been found out that using such a stop device alone does not meet the required accuracy with respect to the irradiance uniformity.

Another approach is to improve the field defining component that determines not only the geometrical shape, but has also a great impact on the intensity distribution in the reticle plane. Conventional field defining components are realized as diffractive optical elements or as refractive optical elements, for example micro-lens arrays.

Diffractive optical elements have the disadvantage that the zero's diffraction order cannot be sufficiently suppressed. As a result, the intensity distribution in the reticle plane comprises an array of bright spots. Apart from that, diffraction angles of more than about 18° require minimum feature sizes of the diffraction structures that can only be achieved by electron beam lithography. Blazed flanks of such minute diffraction structures have to be approximated by very few, for example 2, steps. This significantly reduces the diffraction efficiency of the device to values below 80%. In addition, the manufacture by electron beam lithography is a very slowly process so that these elements are extremely expensive.

Refractive optical elements, on the contrary, allow to introduce comparatively large angles. The main drawback of refractive optical elements, however, is the fact that the intensity distribution generated in the far field and thus in the reticle plane is not sufficiently uniform. Instead of being flat, the intensity distribution is characterized by a plurality of ripples that cannot be tolerated.

From WO 2005/015310 A2 an illumination system is known in which two different optical raster elements are positioned in two different pupil planes. One optical raster element increases the geometrical optical flux in a scan direction and the other optical raster element in a direction which is perpendicular to the scan direction.

U.S. Pat. No. 4,682,885 A discloses an illumination system with an optical integrator that includes four arrays of parallel cylinder lenses. Two arrays have cylinder lenses extending along the scan direction and having a first focal length. The other two arrays have cylinder lenses that extend perpendicular to the scan direction and have a second focal length that is larger than the first focal length.

U.S. Pat. No. 6,243,206 B1 discloses an illumination system in which a first microlens array is arranged in an object plane of an objective that comprises zoom optics and an axicon lens pair. The objective makes it possible to modify the irradiance distribution in its exit pupil and therefore the angular distribution of the illumination light bundle impinging on the mask. A second microlens array is arranged between the objective and a scattering element which is arranged in front of a honeycomb condenser (fly-eye optical integrator).

A similar illumination system is known from U.S. Pat. No. 6,583,937 B1. Here the second microlens array is dispensed with. The scattering element is arranged in the vicinity of an intermediate field plane.

SUMMARY OF THE INVENTION

It is an object of the invention to provide an illumination system for a microlithographic projection exposure apparatus that produces a very uniform irradiance on a reticle plane.

This object is achieved by an illumination system for a microlithographic projection exposure step-and-scan apparatus that comprises a light source, a first optical raster element and a second optical raster element. The first optical raster element extends in or in close proximity of a first pupil plane of the illumination system and includes a plurality of first substructures that are designed such that the geometrical optical flux of the system is increased in a first direction. This direction is at least substantially perpendicular to a scan direction of the projection exposure apparatus. The second optical raster element extends in or in close proximity of a second pupil plane of the illumination system, which is not necessarily different from the first pupil plane, and includes a plurality of second substructures that are designed such that the geometrical optical flux of the system is increased both in the first direction and a second direction that is at least substantially parallel to the scan direction.

By providing two different optical raster elements it is possible to increase the geometrical optical flux independently for two perpendicular directions. This is advantageous because usually the illuminated field on a reticle has a rectangular geometry in which the short sides of the rectangle are aligned parallel to the scan direction. As a result, the increase of the geometrical optical flux required for the scan direction is smaller than in the direction perpendicular thereto. This allows to optimize two or more optical raster elements for their respective task, i.e. to generate a desired intensity distribution in one direction. The better the far field intensity distribution generated by the raster elements is adapted to the desired geometry of the illuminated field, the less are light losses incurred by field stops.

Having a second optical raster element that increases the geometrical optical flux in both directions has the advantage that non-uniformities of the intensity distribution in the first direction caused by the first optical raster element can be eliminated by the second optical raster element.

The sequence of the first and the second or further optical raster elements is usually arbitrary. Each of the optical raster elements may be configured, as non-restricting examples, as a two-dimensional arrangement of diffractive structures, an array of refractive micro-lenses or an array of phase-step or grey-tone Fresnel lenses. Further examples for possible configurations for optical raster elements are described in U.S. Pat. No. 6,285,443.

The optical raster elements should be positioned as close as possible to the pupil plane. However, often other optical elements have to be arranged or in close proximity to these planes. Therefore it may be necessary to shift the optical raster elements slightly along the optical axis out of the ideal position within the planes. Slight deviations from this ideal position, however, often do not significantly deteriorate the function of the optical raster elements. The amount by which the optical raster elements may be shifted in this manner without intolerably deteriorating the optical properties thereof depend on the specific layout of the illumination system and, more particularly, its numerical aperture.

Preferably the first and the second optical raster element cause an intensity distribution in the reticle plane along the second direction that has a slope with smooth transitions between a zero intensity level and a top intensity level. This is advantageous because it reduces the adverse effects on the irradiance uniformity caused by the pulse quantization effect. Ideally the slope has at least substantially a Gaussian shape because then the pulse quantization effect does not occur.

The second optical raster element may alone cause an intensity distribution in the reticle plane along the second direction that has such a slope. If the intensity distribution produced by the first optical raster element in the second direction is also Gaussian, the combination of both elements will also result in an intensity distribution of Gaussian shape.

A Gaussian intensity distribution in the second direction will be produced by the first optical raster element if it produces alone, i.e. without the second optical raster element, an intensity distribution in a reticle plane that has at least substantially the shape of a line being parallel to the second direction. This is due to the fact that this line will, due to the Gaussian laser profile, also have a Gaussian distribution. Such a first optical raster element may be realized by an array of paired parallel cylindrical micro-lenses that extend along the second direction.

The second optical raster element may be realized as scattering element. Such a scattering element is characterized in that refractive or diffractive substructures are positioned over the area of the element in an at least partly random manner. For that reason a scattering element is particularly useful for eliminating ripples or other non-uniformities in the intensity distribution caused by the first optical element.

If the scattering element is realized as a refractive scattering plate comprising a plurality of micro-lenses having a random shape, this will usually result in a rotationally symmetric intensity distribution if this element is taken alone. With computer generated holograms as scattering elements it is possible to produce different intensity distributions for the first and the second direction.

In another advantageous embodiment the first optical raster element is a refractive optical element and the second optical raster element is a diffractive optical element. A refractive optical element usually makes it possible to increase the geometrical optical flux by a large amount. A diffractive optical element, on the other hand, is usually more suited for producing a precisely shaped intensity distribution as long as only small diffraction angles are involved. Since the increase of the geometrical optical flux is mainly achieved by the refractive optical element, the diffractive optical element has to increase the geometrical optical flux only by a comparatively small amount. As a consequence, the minimum feature size of the diffraction structures can be large enough to avoid polarization effects. Apart from that, the blaze flanks of larger diffraction structures can be approximated by more, for example 8, steps, so that the diffraction efficiency can be more than 90%.

The second optical raster element may be positioned behind or in front of the first optical raster element. The first and the second optical raster element do not have necessarily to be separate parts. For example, it is possible to use a first optical raster element that comprises an array of micro-lenses having a curved surface that is provided with diffractive structures forming the second optical raster element.

According to another embodiment the first optical raster element comprises a plurality of parallel prisms having a cross-section that has at least substantially the shape of a rectangular triangle. The cross-sections of at least two prisms differ with respect to an angle which hypotenuses of the triangles form with a reference plane. The second optical raster element may then comprise a plurality of zones that have different diffraction structures, wherein each of the zones corresponds to one prism of the first optical element.

If the uniformity in the scan direction is still not sufficient, the illumination system may further comprise a stop device having two opposing rows of adjacent blades that are arranged parallel to the second direction and can be selectively inserted into an illumination light bundle produced by the light source. Such stop devices are known as such in the art and may be used to correct deficiencies in the intensity distribution caused by the first and the second optical raster element.

It is another object of the invention to provide an illumination system for a microlithographic projection exposure apparatus that produces an elongated irradiance distribution in a reticle plane, has a simple construction and a long service life.

This object is solved by an illumination system comprising, along a light propagation direction, a light source and a first optical raster element that extends in or in close proximity of a pupil plane of the illumination system and includes an array of parallel elongated first micro-lenses extending along a first direction which is at least substantially perpendicular to a scan direction of the projection exposure apparatus. A second optical raster element extends in or in close proximity of a second pupil plane of the illumination system, which is not necessarily different from the first pupil plane, and includes an array of parallel elongated second micro-lenses extending along a second direction which is perpendicular to the scan direction. A third optical raster element is positioned at least substantially in a focal plane of the second micro-lenses and includes an array of parallel elongated third micro-lenses that extend along the second direction, said second and third micro-lenses having curved surfaces that are facing each other. A fourth optical raster element is positioned at least substantially in a focal plane of the first micro-lenses and includes an array of parallel elongated fourth micro-lenses that extend along the first direction.

In such an arrangement the second and the third optical raster element may be arranged with a very small distance, for example about 1 mm or even less the 0.5 mm, in between. This is advantageous because it allows to design these elements such that they have a very high refractive power and thus a short focal length. Short focal lengths are required for achieving a high numerical aperture, for example in the range of about 0.3, on the exit side in the second direction, i.e. perpendicular to the scan direction. In a step-and-scan apparatus this second direction is the direction in which an elongated illuminated field has its longer extension.

Since the curved surfaces of the second and third micro-lenses are facing each other, small focal lines with very high light intensities within the micro-lenses or a substrate supporting the micro-lenses are, at least to a certain extent, avoided. Such high light intensities may destroy the micro-lenses or the substrate very quickly. As a further result of this, the raster elements may be designed very thin and with elongated micro-lenses having a width of 0.5 mm or even less.

The micro-lenses may be conventional cylinder lenses. The term "cylinder lens" usually refers to lenses comprising a surface area having the shape of a regular cylinder. However, it is also envisaged to use micro-lenses comprising a surface having the shape of a non-regular cylinder, for example micro-lenses with a cross-section having an elliptical section. Furthermore the micro-lenses do not necessarily have to be cylindrical at all, but may be reniform or crescent-shaped. Such alternative shapes of the microlenses may be advantageous if a curved illuminated field is desired.

If the first optical raster element is attached to the second optical raster element and the third optical raster element is attached to the fourth optical raster element, a very compact and easy construction is achieved.

A scattering element arranged in or in close proximity of the first or the second pupil plane further enhances the irradiance uniformity in the reticle plane.

According to another aspect of the invention, an illumination system for a microlithographic projection exposure apparatus comprises a light source and a scattering arrangement producing a scattering effect that varies during exposures. This avoids undesired interactions between scattering structures contained in the scattering arrangement on the one hand and regular features contained in a field defining element. Such interactions may otherwise cause irradiance fluctuations in the mask plane.

For producing a varying scattering effect, a scattering plate of foil may be moved, or acoustic waves may be produced in a scattering plate. According to yet another embodiment, the scattering arrangement comprises scattering particles floating in a liquid.

BRIEF DESCRIPTION OF THE DRAWINGS

An embodiment of the invention is described in detail below this reference to the drawings in which.

DESCRIPTION OF PREFERRED EMBODIMENTS

Figure 1:
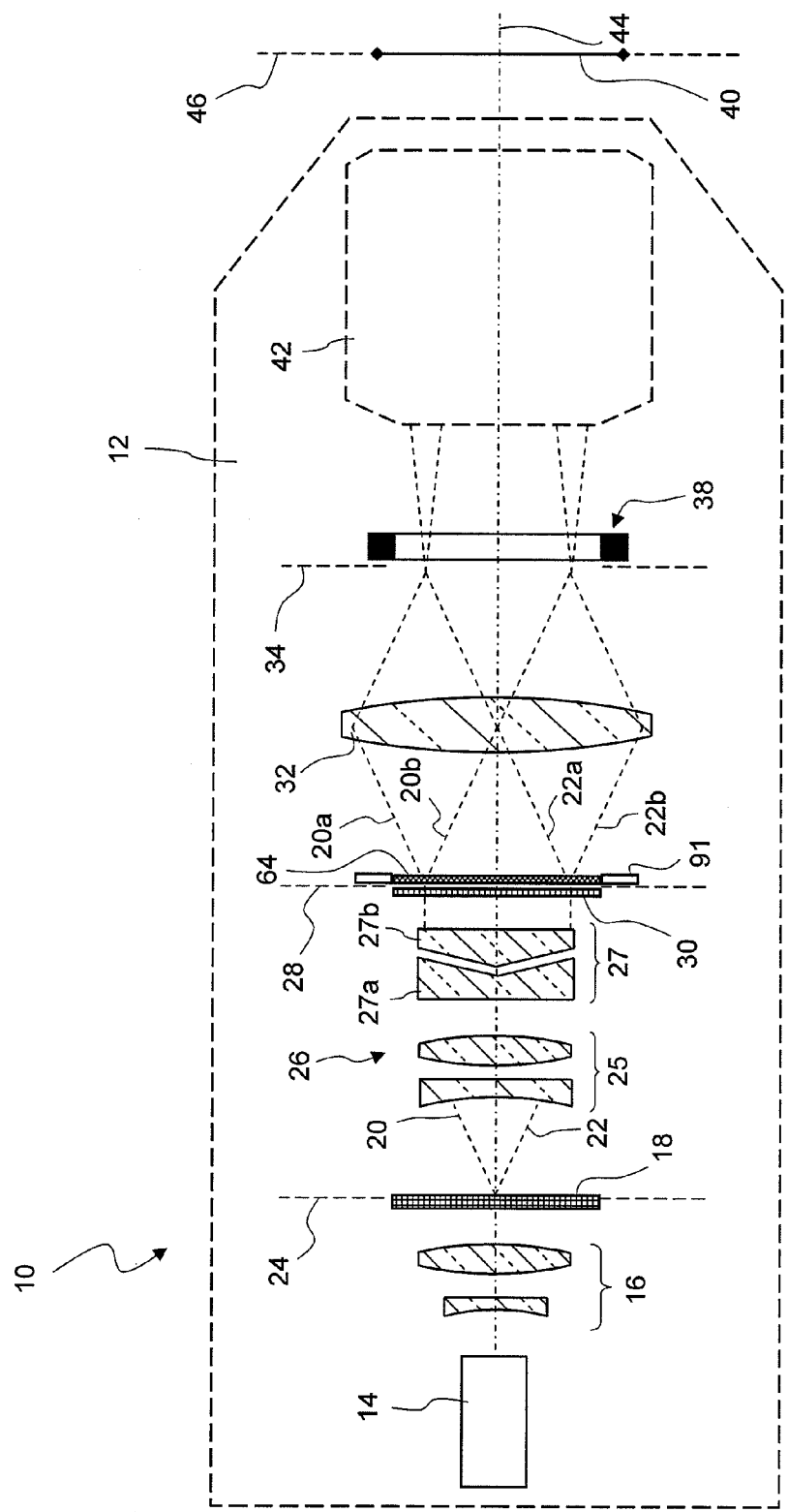
FIG. 1 shows a meridional section through an illumination system according to a first embodiment of the present invention.

FIG. 1 shows a meridional section of an illumination system according to the present invention that is to be used in a projection exposure step-and-scan apparatus. For the sake of clarity, the illustration shown in FIG. 1 is considerably simplified and not to scale. The illumination system, which is denoted in its entirety by 10, comprises a light source that is, in the embodiment shown, realized as an excimer laser 14. The excimer laser 14 emits illumination light that has a wavelength in the deep ultraviolet (DUV) spectral range, for example 193 nm. The illumination light emerging from the exit facet of the laser 14 forms a partially coherent light bundle having a small cross section and a low divergence. Thus the geometrical optical flux of the light bundle as emitted by the laser 14 is small.

The light bundle then enters a beam expansion unit 16 in which the light bundle is expanded. Since the light bundle is diverted at refractive interfaces, the cross section of the light bundle is increased without altering the geometrical optical flux of the bundle. This is due to the fact that the geometrical optical flux is an invariable quantity for light bundles that are refracted at interfaces between optical media having differing indices of refraction.

After passing through the beam expansion unit 16 the illumination light bundle impinges on a diffractive optical element 18. The diffractive optical element 18 comprises one or more diffraction gratings that deflect each impinging ray such that a divergence is introduced. In FIG. 1 this is schematically represented for an axial ray that is split into two diverging rays 20, 22. The diffractive optical element 18 thus modifies the angular distribution of the illumination light bundle and also enlarges its geometrical optical flux. Since diffractive optical elements of this kind that are suited for this purpose are known in the art as such, see for example, U.S. Pat. No. 6,285,443, the diffractive optical element will not be described in further detail below.

The diffractive optical element 18 can also be replaced by any other kind of optical raster element, for example a micro-lens array in which the micro-lenses are formed by Fresnel zone plates. Further examples for optical raster elements that are suitable for this purpose are given in the aforementioned U.S. Pat. No. 6,285,443.

The diffractive optical element 18 is positioned in a focal plane 24 of a first objective 26 that is only indicated by a zoom lens group 25 and a pair 27 of axicon elements 27a, 27b. Reference numeral 28 denotes an exit pupil plane of the first objective 26.

A field defining component 30, which will be explained in more detail below and consists of two optical raster elements, is positioned in the pupil plane 28 of the first objective 26. The field defining component 30 again introduces a divergence for each point and thus enlarges the geometrical optical flux of the illumination light bundle a second time. The divergence introduced by the field defining component 30 is schematically represented in FIG. 1 by divergent rays 20a, 20b and 22a, 22b for the impinging rays 20 and 22.

The diverging rays 20a, 20b and 22a, 22b enter a second objective 32 that is represented in FIG. 1 by a single condensor lens 32. The second objective 32 is arranged within the illumination system 10 such that its entrance pupil plane coincides with the exit pupil plane 28 of the first objective 26. The image plane 34 of the second objective 32 is a field plane in which a reticle masking (REMA) unit 38 is positioned.

The reticle masking unit 38 comprises a first subunit having two pairs of opposing adjustable blades that delimit the illuminated field in a direction parallel to a scan direction of the exposure apparatus into which the illumination system 10 is integrated. The reticle masking unit 38 may also comprise a second subunit that delimits the illuminated field in a direction perpendicular to the scan direction. To this end the second subunit has two opposing rows of adjacent blades that are arranged parallel to the scan direction and can be selectively inserted into the illumination light bundle produced by the light source 14. Such a second subunit may be used for further improving the irradiance uniformity. An example for such a second subunit is given in EP 1 020 769 A2 whose contents are incorporated herein by reference.

The reticle masking unit 38 thus forms a stop that ensures sharp edges of the illuminated field in the scan direction. To this end, a third objective 42 having an object plane that coincides with the image plane 34 of the second objective is arranged along an optical axis 44 of the illumination system 10. In an image plane 46 of the third objective 42, which is also referred to as REMA objective, the reticle 40 is positioned.

Figure 2:
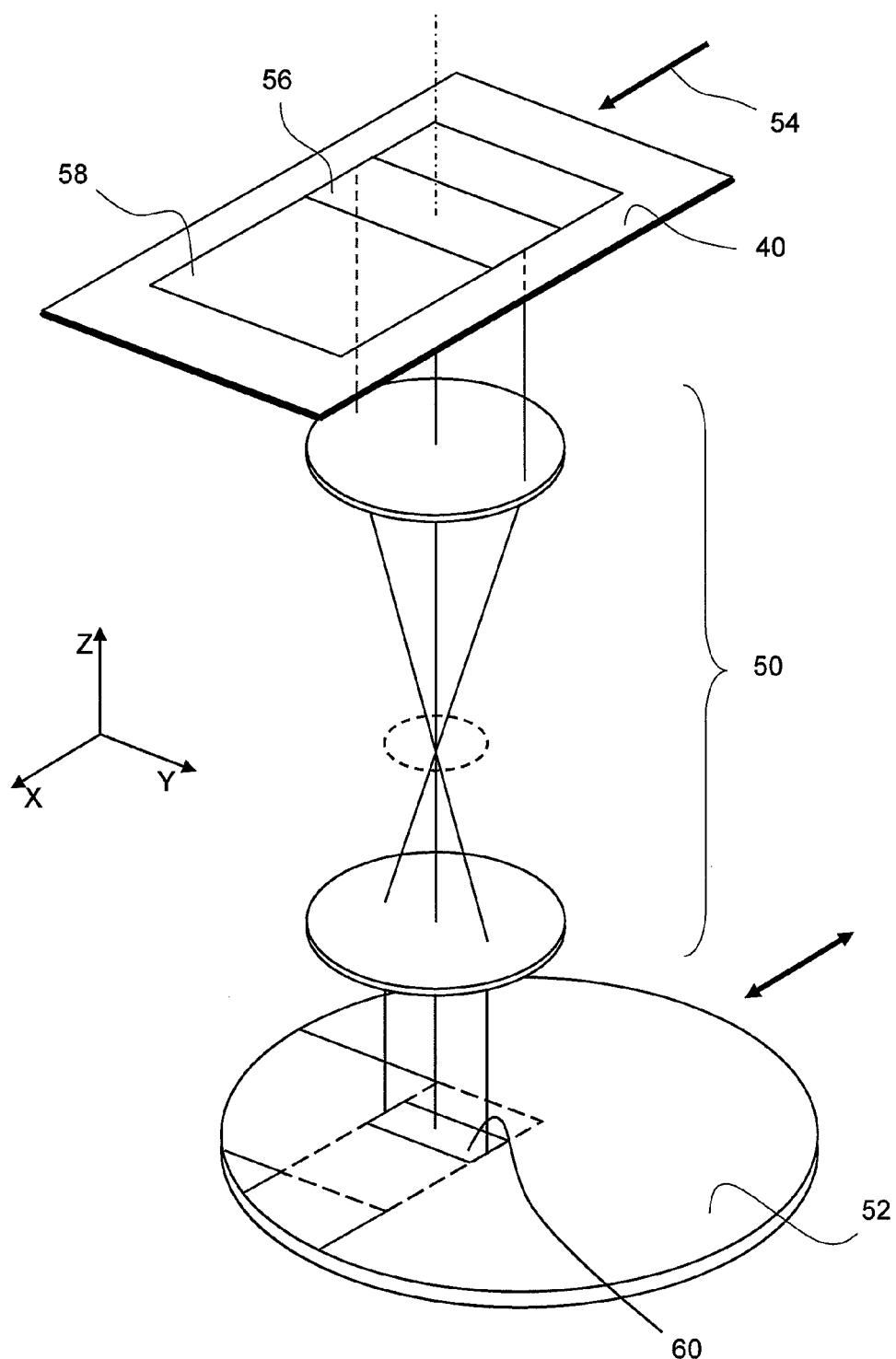
FIG. 2 shows in perspective schematic view how a pattern contained in a reticle is imaged by a projection lens onto a wafer.

FIG. 2 shows in a perspective schematic view how a pattern contained in the reticle 40 is imaged by a projection lens 50 onto a wafer 52 that is covered with a photoresist. While the reticle 40 is moved along the scan direction that is indicated by an arrow 54 and coincides with the X direction, an illuminated field 56 in the form of a rectangular slit scans a patterned area 58 of the reticle 40. At a given instance, only those parts of the patterned area 58 that are within the illuminated field 56 are projected by the projection lens 50 onto the wafer 52 and form an image 60 of the patterned area 58 on the wafer 52. The image 60 is reduced in size by the reduction factor of the projection lens 50 which may be equal to, for example, ¼.

Figure 3:
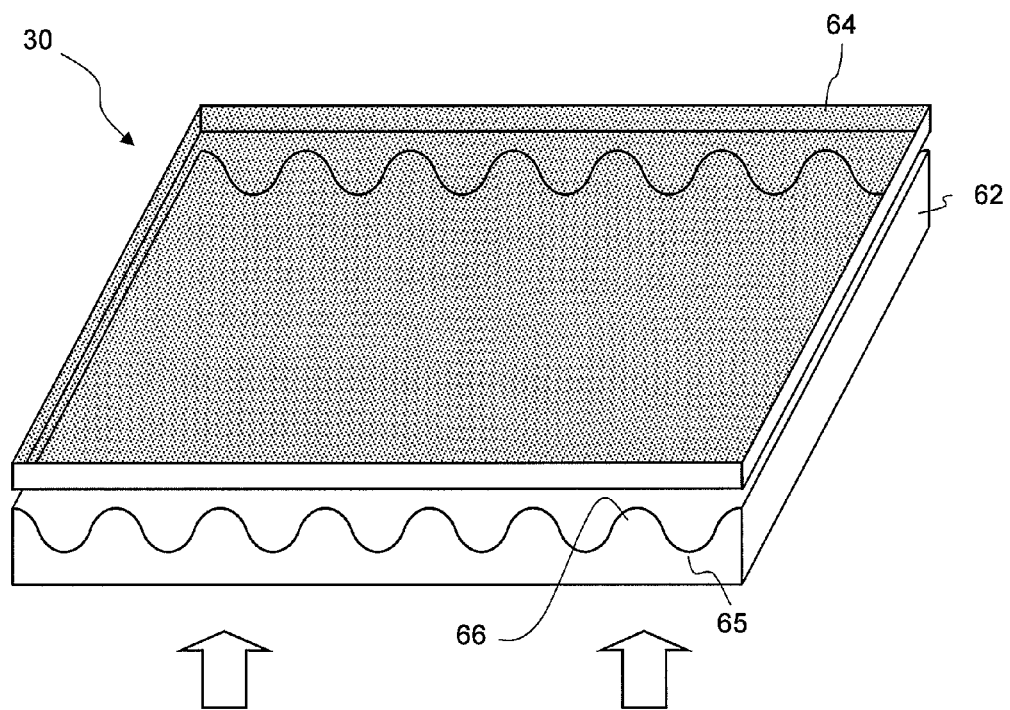
FIG. 3 shows first embodiment of a field defining component in a perspective view.
Figure 4:
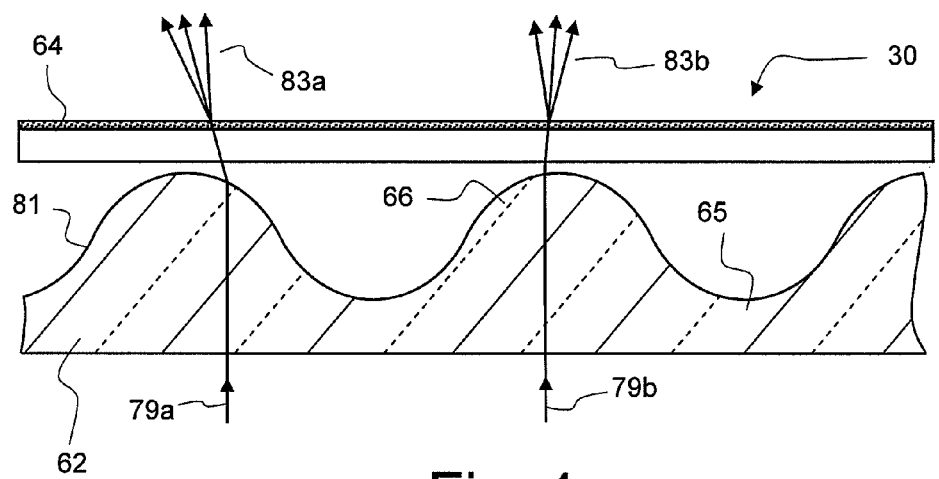
FIG. 4 shows the field defining component of FIG. 3 in a cross section.

FIGS. 3 and 4 show a first embodiment of the field defining component 30 in a perspective view and a cross section, respectively. The field defining component 30 consists of a first refractive optical element 62 and a scattering plate 64. The refractive optical element 62 comprises a plurality of cylindrical micro-lenses 65, 66 that are oriented with their longitudinal axes along the X-direction. Each pair of adjacent micro-lenses 65, 66 have curvatures with opposite signs so that concave micro-lenses 65 and convex micro-lenses 66 alternate. In FIGS. 3 and 4 only several cylindrical micro-lenses 65, 66 are shown. In reality, there may be many hundreds of such micro-lenses.

The scattering plate 64 is, in the embodiment shown, a special diffractive optical element that is usually referred to as computer generated hologram (CGH). Such CHGs can be designed such that the geometrical optical flux is increased only in one direction or in both directions.

The refractive optical element 62 as such, i.e. without the scattering plate 64, would produce a narrow line parallel to the Y-direction in the reticle plane 46. The width of the line is mainly determined by the intensity distribution (laser profile) of the excimer laser 14.

Figure 5:
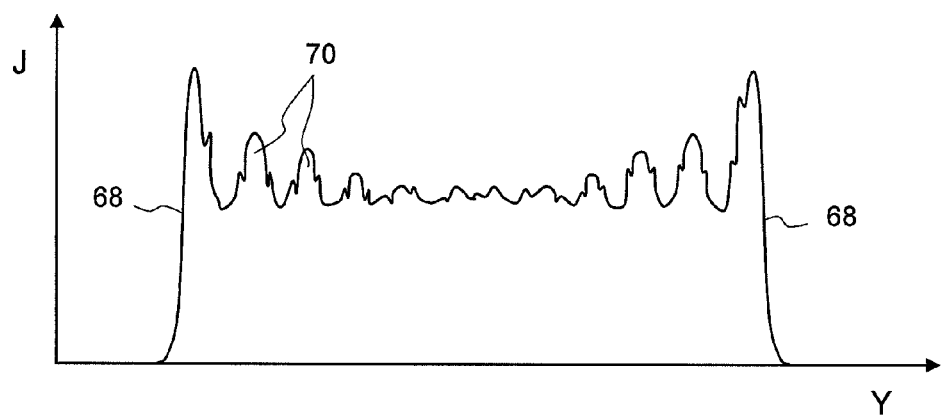
FIG. 5 shows an intensity distribution produced by a refractive optical element in the Y-direction.

FIG. 5 shows the intensity distribution that would be generated by the refractive optical element 62 in the reticle plane 46 in the Y-direction, i.e. perpendicular to the scan direction, if the scattering plate 64 was not present. In the graph of FIG. 5 it can be seen that this intensity distribution has steep slopes 68 and a number of ripples 70 whose altitude increases towards the slopes 68. If the reticle 40 was illuminated with an illumination light bundle having the intensity distribution shown in FIG. 5 along the Y-direction, this would result in considerable undesired structure size variations of the microstructured device that is to be produced by the exposure projection apparatus. This is due to the fact that if the intensity distribution in the reticle plane 46 is non-uniform, the same will also apply to the intensity distribution on the photoresist. Since the photoresist has a very sharp exposure threshold, intensity variations on the photoresist directly translate into size variations.

Figure 6:
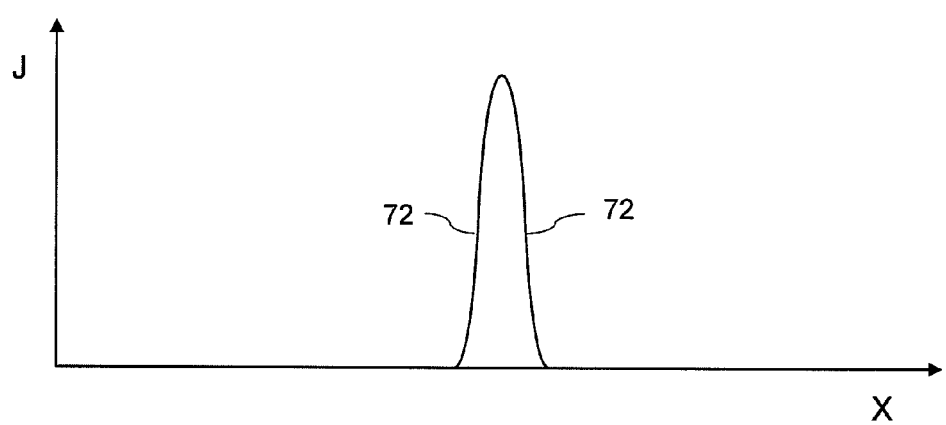
FIG. 6 shows an intensity distribution produced by a refractive optical element in the X-direction.

FIG. 6 shows the intensity distribution produced by the refractive optical element 62 in the reticle plane 46 in the X-direction, i.e. the scan direction. The intensity distribution is mainly given by the laser profile and thus has a Gaussian shape with two steep slopes 72.

Figure 7:
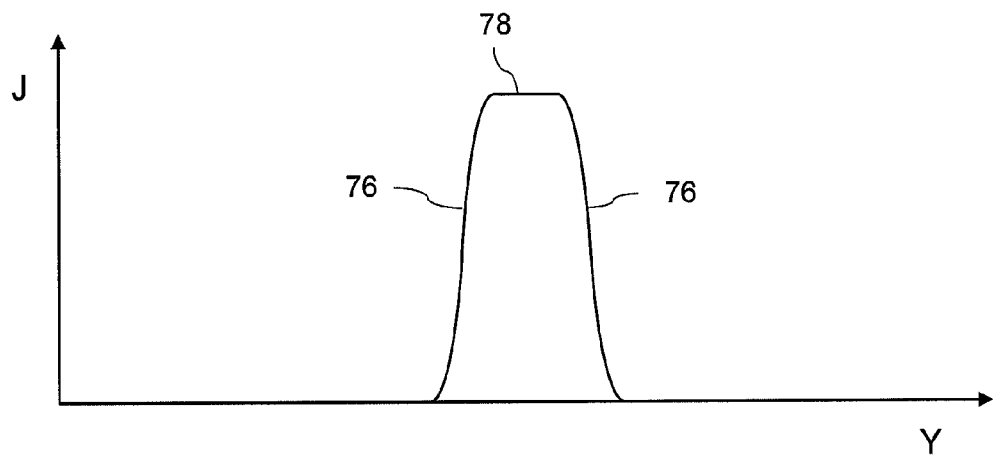
FIG. 7 shows an intensity distribution produced by a scattering plate in the Y-direction.
Figure 8:
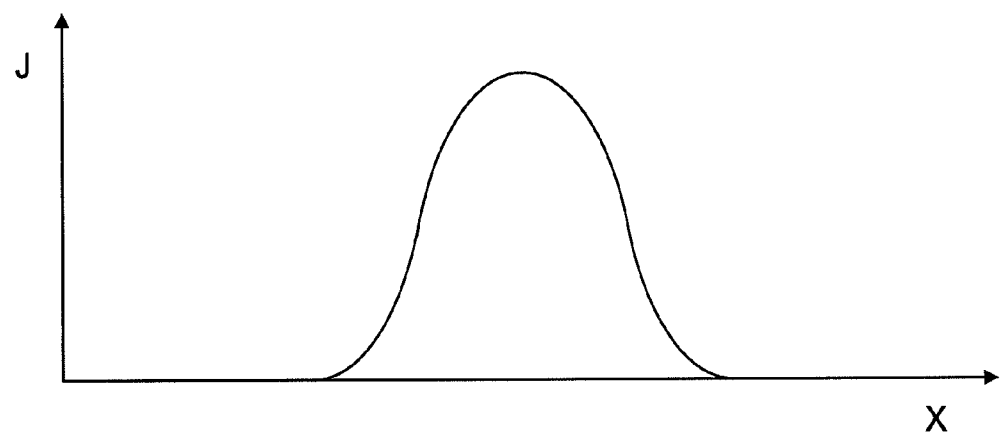
FIG. 8 shows an intensity distribution produced by a scattering plate in the X-direction.

FIGS. 7 and 8 show graphs that illustrate the intensity distribution that would be generated by the scattering plate 64 in the reticle plane 46 in the Y- and X-direction, respectively, if the refractive optical element 62 was not present. The scattering plate 64 is designed such that it produces in the Y-direction, i.e. perpendicular to the scan direction, an intensity distribution with steep slopes 76 and a small flat section 78. In the X-direction, a broader intensity distribution 77 is produced that has approximately a Gaussian shape.

The combination of the refractive optical element 62 and the scattering plate 64 results in intensity distributions that can mathematically be described as convolutions of the intensity distributions produced by each element alone. If seen from a more illustrative point of view, the scattering plate 64 blurs the intensity distribution produced by the refractive optical element 62 in both directions to different degrees. This results in a considerable improvement of the uniformity of the intensity distribution on the photoresist. This is explained in the following with reference to FIGS. 9 and 10.

Figure 9:
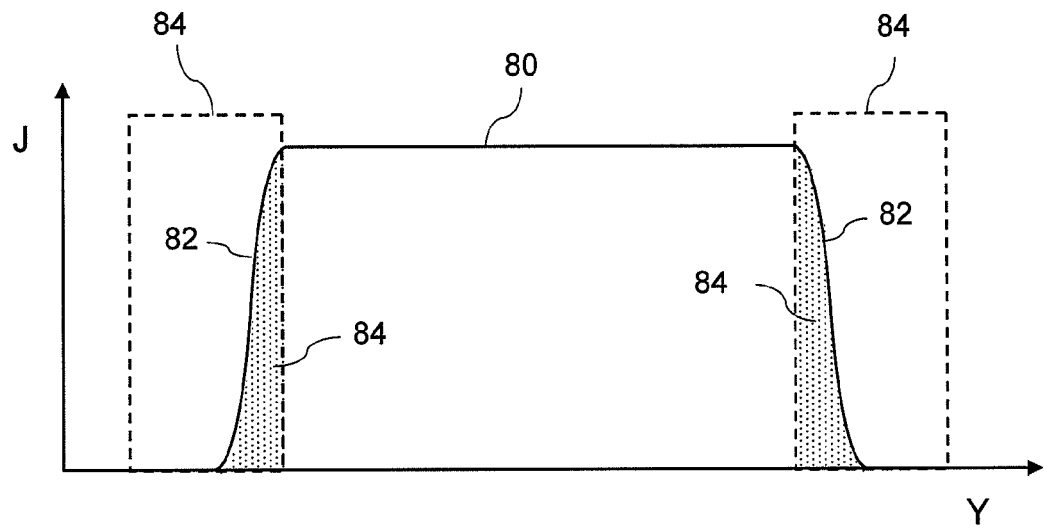
FIG. 9 shows an intensity distribution produced by the field defining component of FIGS. 3 and 4 in the Y-direction.

FIG. 9 shows the resulting intensity distribution caused by the field defining component 30 in the reticle plane 46 in the Y-direction, i.e. perpendicular to the scan direction. The convolution of the intensity distributions shown in FIGS. 5 and 7 results in an intensity distribution having an almost completely flat section 80 and slightly broader sloped parts 82 that delimit the intensity distributions at the lateral sides of the illuminated field 56.

The flat section 80 is a result of the blurring effect that is caused by the scattering plate 64 and eliminates the ripples 70. This blurring effect is illustrated in FIG. 3 by two light rays 79a and 79b that enter the refractive optical element 62 in the direction indicated by arrows. The rays 79a, 79b undergo refraction at curved surfaces 81 of the cylindrical micro-lenses 65, 66 so that the geometrical optical flux is increased. The refracted rays 79a, 79b then enter the scattering plate 64 where the geometrical optical flux is increased a second time so that the rays 79a, 79b emerge from the scattering plate 64 not as single rays but as diverging bundles 83a and 83b, respectively. The angular distribution within the bundles 83a, 83b is determined by the pattern of the diffractive structures in the computer generated hologram (CHG) that forms the scattering plate 64.

In order to achieve sharp edges of the illuminated field 56 at the lateral sides, i.e. parallel to the scan direction, the blades of the first subunit of the reticle masking unit 38 are adjusted so that they stop out the slopes 82 completely. The position of the blades is indicated in FIG. 9 by broken lines 84. Since both slopes 82 are steep, the dotted areas 86 under these slopes 82 are small. These dotted areas 84 represent the light energy that is lost by stopping out this part of the illuminated field 56. The steeper the slopes 76 of the intensity distribution produced by the scattering plate 64 alone (see FIG. 7), the smaller are the dotted areas 84 and thus the light losses caused by the stops of the reticle masking unit 38 in the Y-direction.

Figure 10:
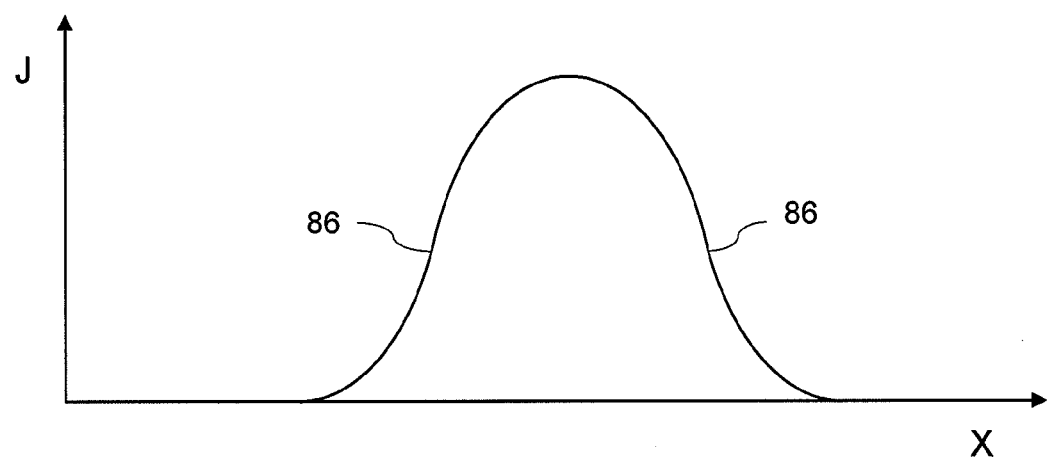
FIG. 10 shows an intensity distribution produced by the field defining component of FIGS. 3 and 4 in the X-direction.

FIG. 10 shows the intensity distribution produced by the combination of the refractive optical element 62 and the scattering plate 64 in the reticle plane 46 in the X-direction, i.e. the scan direction. The convolution of the narrow line of Gaussian shape, which is produced by the refractive optical element 62 and shown in FIG. 6, with the Gaussian intensity distribution that is produced by the scattering plate 62 and shown in FIG. 8 results in an intensity distribution that has also Gaussian slopes 86. This is due to the fact that the convolution of two Gaussian functions does not alter the form and thus yields again a Gaussian function. In the scan directions there is no need to stop out a part of this intensity distribution, because the illuminated field 56 scans over the patterned area 58 of the reticle 40 so that the illuminated field 56 only needs to be stopped out at the beginning and the end of each scan process.

The broad Gaussian slopes 86 of the intensity distribution shown in FIG. 10 have the significant advantage that the pulse quantization effect cannot occur. This considerably improves the uniformity of the irradiance on the photoresist.

Figure 11:
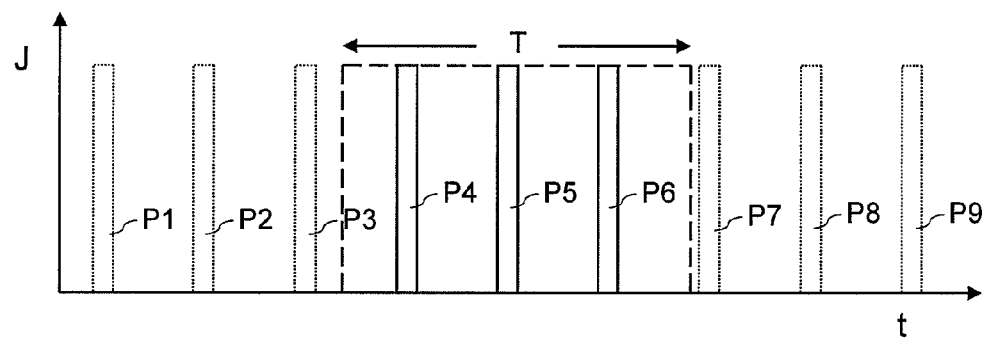
FIGS. 11 and 12 show intensity distributions on the time scale that illustrate the pulse quantization effect.

The pulse quantization effect is explained in the following with reference to FIGS. 11 and 12. FIG. 11 shows a graph illustrating the light intensity to which a first point on the patterned area 58 is exposed while moving along the scan direction X through the illumination light bundle. The time window during which this point can be exposed to illumination light has a length T. Light pulses that are emitted by the excimer laser 14 are represented by elongated rectangles P1, P2, . . . , P9. Here it is assumed that the first point is exposed to three consecutive pulses P4, P5, and P6 during its movement through the illumination light bundle.

Figure 12:
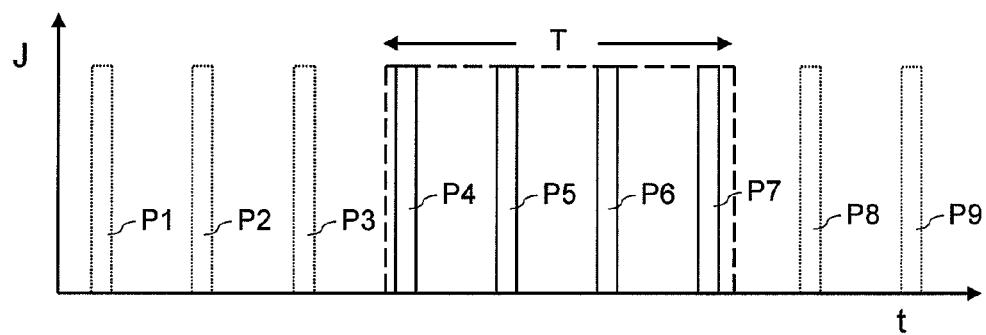

FIG. 12 shows a similar graph, but for a second point on the patterned area 58 which is positioned—if seen in the scan direction X—in front of the first point so that it is exposed earlier. However, the time window of length T has now a different time relationship to the sequence of pulses P1 to P9. As a result, not only three pulses, but four pulses P4, P5, P6 and P7 contribute to the irradiance on the second point during the time interval of length T. This means that the first point receives only three quarters of the light energy that is received by the second point. Thus different points on the patterned area 58 are not uniformly irradiated although each light pulse P1 to P9 is assumed to have the same intensity.

Figure 13:
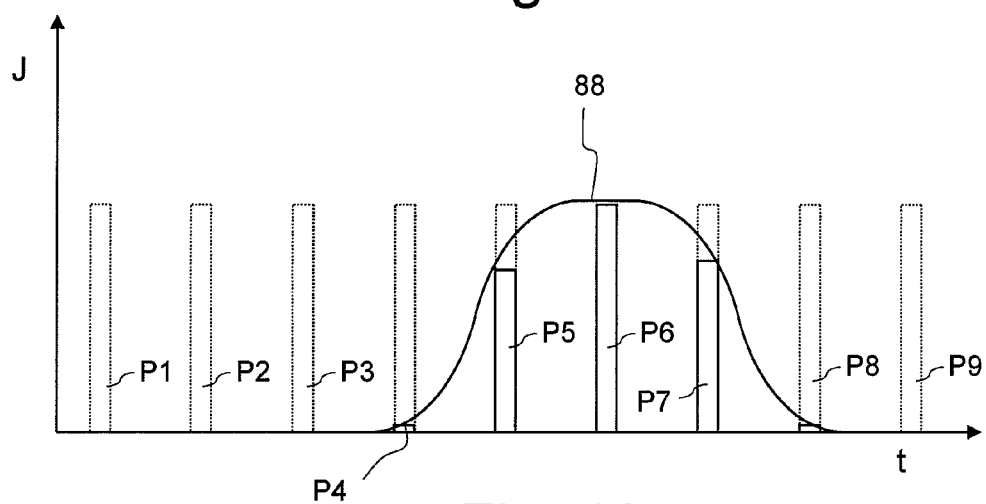
FIG. 13 shows why the pulse quantization effect does not occur with the field defining component of FIGS. 3 and 4.

FIG. 13 shows the situation for the intensity distribution in the X direction which is produced by the combination of the refractive optical element 62 and the scattering plate 64. Due to the smooth slopes 86, the light pulses P1 to P9 do not contribute equally to the irradiance on a specific point on the patterned area 58 of the reticle 40. Instead, the light pulses P4, P5, P7 and P8 contribute with less energy to the irradiance on a specific point. It has been found out that the overall irradiance, i.e. the sum of the areas of the rectangles drawn in FIG. 13 in solid lines, is independent from the position of the time window with respect to the sequence of light pulses P1 to P9. In other words, shifting the light intensity distribution 88 along the time axis does not alter the total area of the rectangles drawn in solid lines.

This holds true exactly only in those cases in which the slopes 86 have a Gaussian shape. The more the slopes 86 deviate from the ideal Gaussian shape, the more contributions from the pulse quantization effect to irradiance non-uniformities are to be expected.

The embodiment described above can be modified in many respects. For example, the intensity distribution produced by the scattering plate 64 alone can be identical for both the X-direction and the Y-direction. If this intensity distribution has a Gaussian shape as shown in FIG. 8, this will result in larger light losses because the dotted areas 84 (see FIG. 9) then become larger. On the other hand, the manufacture of scattering plates that produce rotationally symmetrical intensity distributions is easier and cheaper from a technical point of view. Particularly, the scattering plate 64 can then be realized as a refractive optical element having a plurality of micro-lenses whose shapes differ randomly. Such a scattering plate produces a rotationally symmetrical intensity distribution.

If the pulse quantization effect is of no major concern for the non-uniformity, the intensity distribution in the X-direction (scan direction) does not need to be (approximately) Gaussian. The scattering plate 64 may then produce a rectangular rotationally symmetric intensity distribution, because the blurring of the ripples 70 does not require a Gaussian distribution.

In another alternative of this embodiment the refractive optical element 62 comprises not only cylindrical micro-lenses 65 that are arranged along the Y-direction, but also cylindrical micro-lenses that are arranged along the X-direction. This will produce a rectangle instead of a narrow line in the reticle plane 46. Alternatively, two different refractive elements with cylindrical micro-lenses may be provided that differ with respect to the orientation of the micro-lenses. Since the geometrical optical flux is increased in both directions X, Y by the refractive optical element 62 alone, the scattering plate does not have to increase the geometrical optical flux significantly. Instead, it can be designed such that it merely blurs the ripples 70 in the intensity distribution that are typical for refractive optical elements. If desired it can also broaden the slope of the intensity distribution produced by the refractive optical element in the scan direction X in order to reduce the pulse quantization effect.

The scattering plate 64 can, of course, also be positioned on the other side of the refractive optical element 62 so that the illumination light is scattered before it enters the refractive optical element 62. It is also envisaged to use more than one scattering plates or to use a plate in which scattering structures are applied to both surfaces.

In order to improve the irradiance uniformity it is also possible to provide a manipulator 91 (see FIG. 1) that is adapted to move the scattering plate 64 within the exit pupil 28. Such a movement could be a translational movement within this plane, or a rotation around the optical axis 44. Adverse effects of possible non-uniformities within the scattering plate are thus eliminated. Also a cascade of many scattering plates 64 that rotate in different direction and with different velocities can be provided. Other embodiments of scattering arrangements producing a scattering effect that varies during exposures will be described further below with reference to FIGS. 22 to 25.

Figure 14:
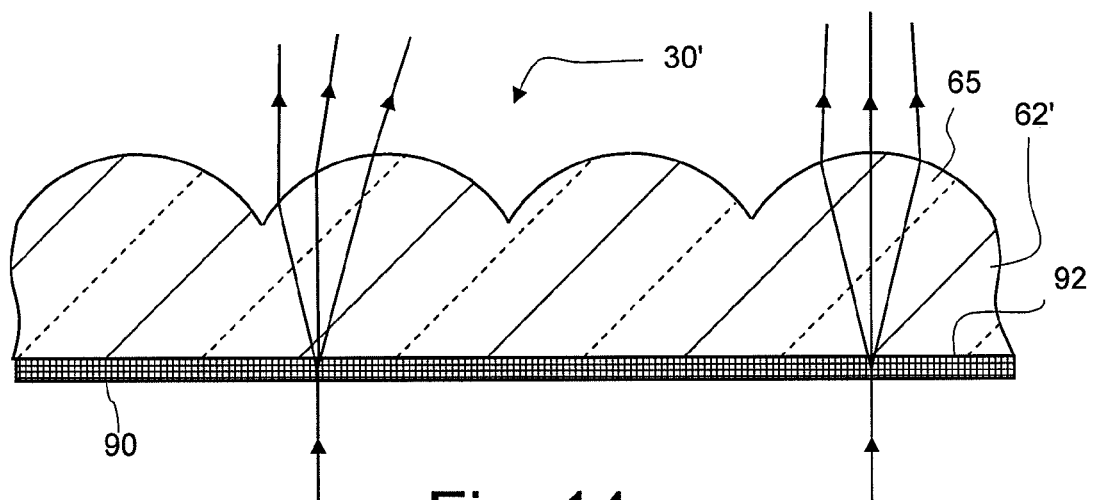
FIG. 14 shows a second embodiment of a field defining component in a cross section.
Figure 15:
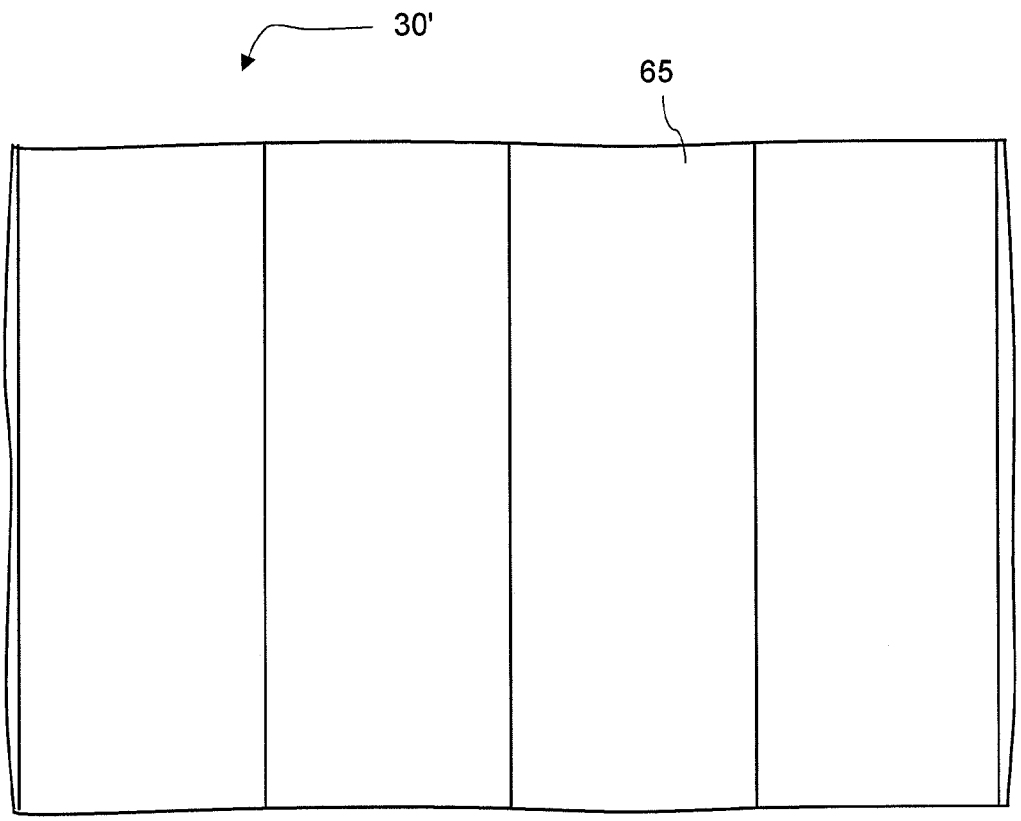
FIG. 15 shows the field defining component of FIG. 14 in a top view.

FIGS. 14 and 15 show another embodiment of a field defining component 30' in a horizontal cross-section and a planar top view, respectively.

The field defining component 30' comprises a refractive optical element 62' having a plurality of laterally adjacent cylinder lenses 65 that are arranged along the X-direction, i.e. parallel to the scan direction. The main difference to the embodiment shown in FIGS. 3 and 4 is that the field defining component 30' comprises instead of a scattering plate 64 a diffractive optical element 90 that is formed on a flat surface 92 of the refractive optical element 62'.

The diffractive optical element 90 increases the geometrical optical flux both in the X-direction and also in the Y-direction. Since the refractive optical element 62' generates a broad intensity distribution similar to the one shown in FIG. 5, the increase of the geometrical optical flux caused by the diffractive optical element 90 can be small in both directions. As a consequence, the diffractive optical element 90 can be realized as a blazed grating in which blaze flanks are approximated by a larger number of steps, for example eight. The better the approximation of the blaze flanks by a stepped curve, the higher is the diffraction efficiency of the grating. Apart from that, the larger diffraction structures have the advantage that they are considerably larger than the wavelength of the illumination light. As a result, the diffractive optical element does not polarize the illumination light bundle as is the case with diffractive elements that have diffraction structures whose size is comparable to the wavelength.

The field defining component 30' has a similar function as the field defining component 30 shown in FIGS. 4 and 5. Due to the increase of the geometrical optical flux in the Y-direction the ripples 70 that are present in the intensity distribution produced by the refractive optical element 62' can be eliminated to a large degree. In addition, the steep slopes 72 of the intensity distribution produced by the refractive optical element 62' in the X-direction can be broadened so that it approximates the ideal Gaussian shape as shown in FIG. 10. Thus also the embodiment shown in FIGS. 14 and 15 improves the uniformity of the irradiance in the reticle plane by eliminating ripples in the Y-direction and reducing the pulse quantization effect.

Figure 16:
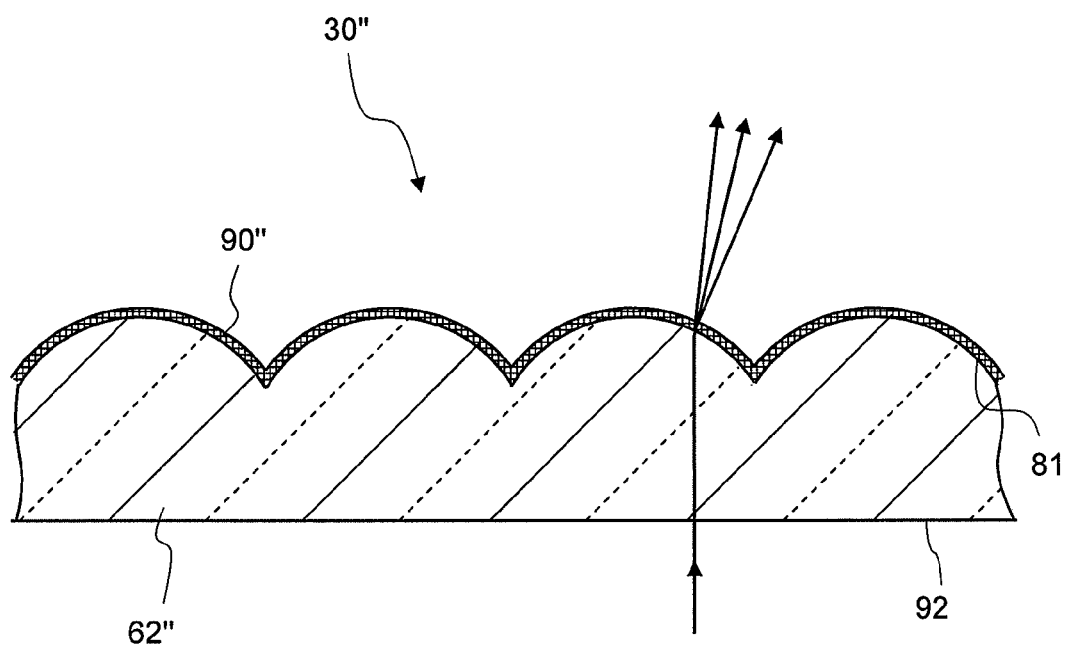
FIG. 16 shows a third embodiment of a field defining component in a cross section.

FIG. 16 shows another embodiment for a field defining component which is denoted in its entirety by 30''. The field defining component 30'' differs from the field defining component 30' shown in FIGS. 14 and 15 in that the diffractive optical element is not provided at the flat surface 92 of the refractive optical element 62', but on its curved surface 81. The diffractive optical element 90'' can be realized, for example, as a computer generated hologram. The field defining component 30'' has substantially the same effect as the field defining component 30' shown in FIGS. 14 and 15.

Figure 17:
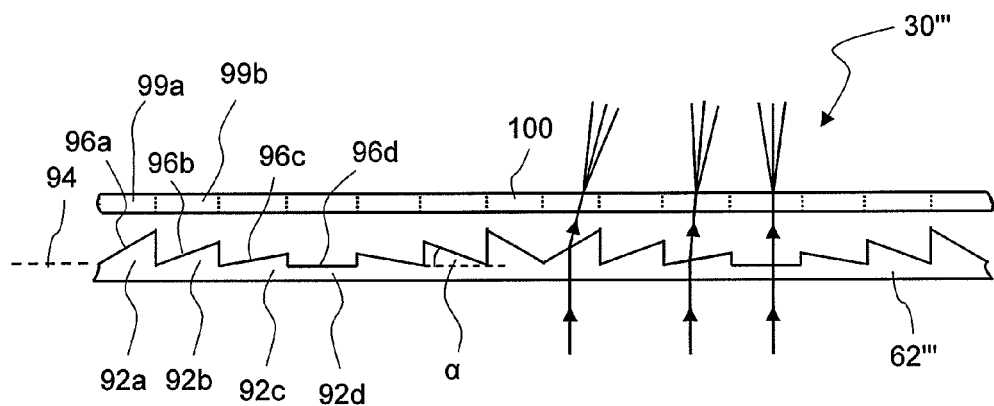
FIG. 17 shows a fourth embodiment of a field defining component in a cross section.

In FIG. 17 another embodiment of a field defining component is illustrated in a horizontal cross-section and denoted in its entirety by 30'''. The field defining component 30''' comprises a refractive optical element 62''' that is composed of a regular array of elongated prisms 92a, 92b, 92c, 92d whose longitudinal axis is aligned parallel to the Y-direction, i.e. perpendicular to the scan direction. The prisms 92a, 92b, 92c, 92d may have a length in the Y-direction of approximately 1 to 3 mm. Each prism 92a, 92b, 92c, 92d has a triangular cross-section with different angles α between a reference plane 94 and hypotenuse areas 96a, 96b, 96c and 96d.

Figure 18:
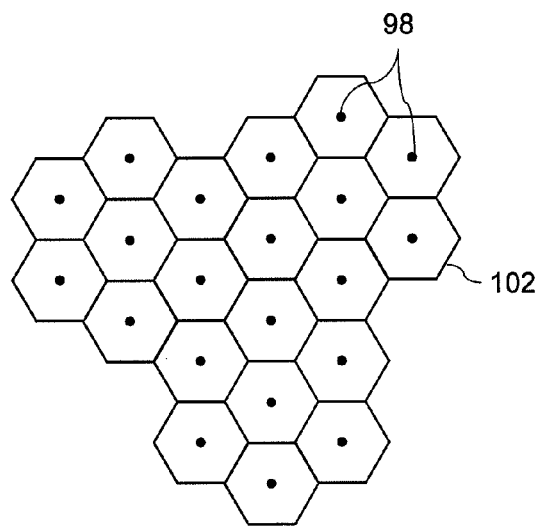
FIG. 18 shows schematically the intensity distribution produced by the field defining component of FIG. 17.

The prisms 92a, 92b, 92c, 92d produce in the reticle plane 46 a pattern of little bright spots 98 as is shown in FIG. 18. The broader the intensity distribution of the laser beam emitted by the excimer laser 14 is, the larger are the spots 98. If the bright spots 98 are distributed over the area very densely, the intensity distributions will overlap so that a continuous intensity distribution with ripples will be produced.

In order to eliminate these ripples, the field defining component 30''' comprises a diffractive optical element 100 that increases the geometrical optical flux both in the X-direction and the Y-direction. This additionally blurs the bright spots 98 so that an almost uniform intensity distribution in the reticle plane 46 may be achieved. In FIG. 18 this is indicated by hexagonal areas 102 that represent the area over which the light energy is distributed from each bright spot 98 by the diffractive optical element 100.

Also in this embodiment the increase of the geometrical optical flux caused by the diffractive optical element 100 is comparatively small so that this element can be manufactured with comparatively large diffraction structures. As a result, the diffractive optical element 100 can have a high diffraction efficiency and does not significantly affect the polarization state of the illumination light.

In order to improve the effect of the diffractive optical element 100, the latter may be subdivided into a plurality of different zones that are separated in FIG. 17 by dotted lines and exemplarily indicated by 99a, 99b. The configuration of the diffractive structures contained in each zone is adapted to the angles that the light rays emerging from the prisms 92a, 92b, 92c, 92d form with the reference plane 94.

Figure 19:
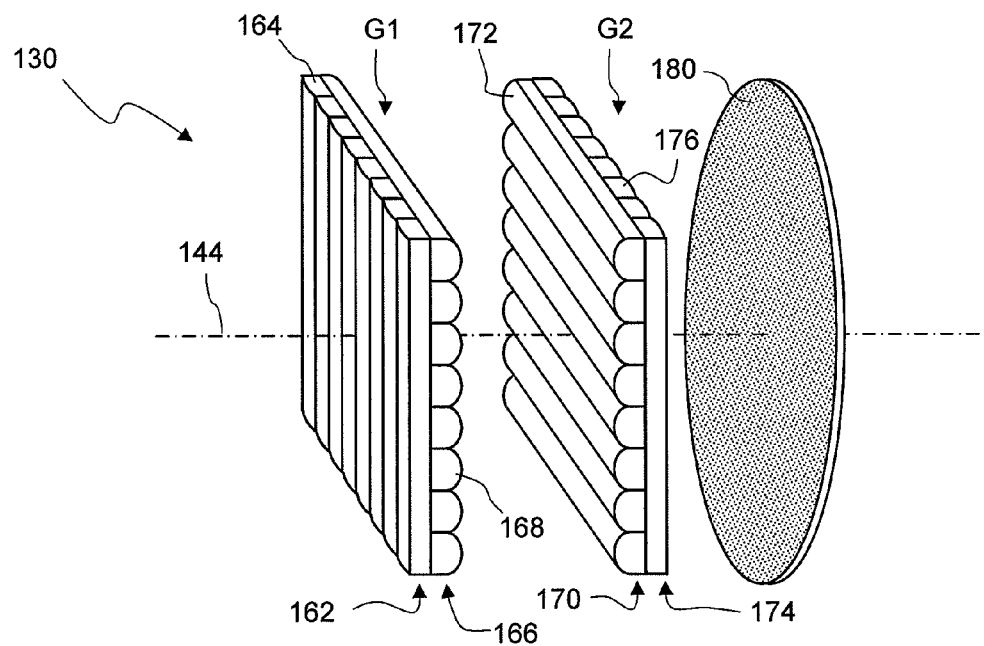
FIG. 19 shows a fifth embodiment of a field defining component in a perspective view.
Figure 19:
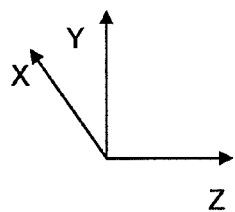
Figure 20:
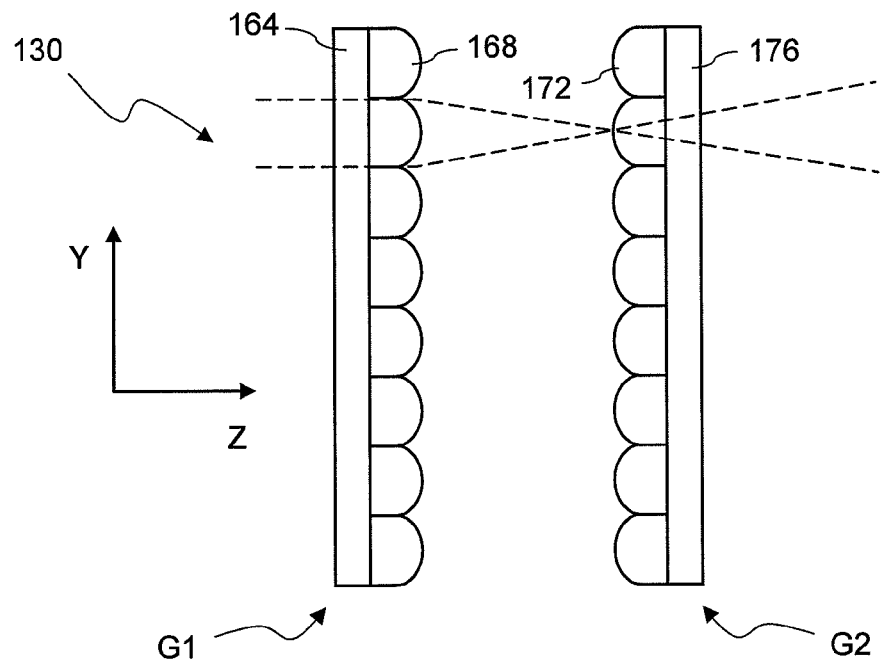
FIG. 20 shows the field defining component of FIG. 19 in sections parallel to the Y-Z plane.
Figure 21:
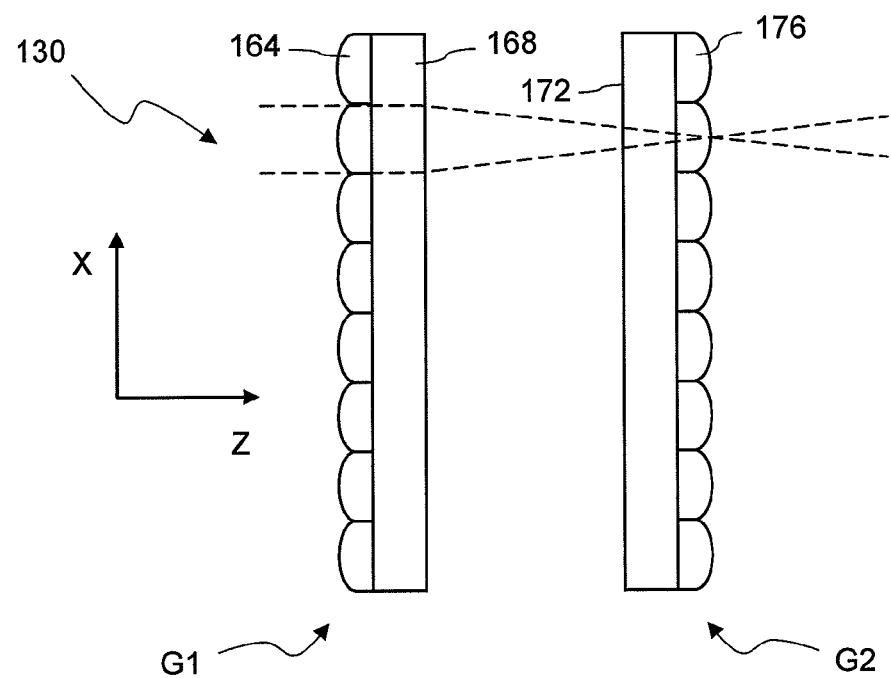
FIG. 21 shows the field defining component of FIG. 19 in sections parallel to the X-Z plane.

FIGS. 19, 20 and 21 show another embodiment of a field defining component in a perspective view and in sections parallel to the Y-Z plane and the X-Z plane, respectively. These illustrations are not to scale and considerably simplified. The field defining component, which is denoted in its entirety by 130, comprises two groups G1, G2 of arrays of cylindrical micro-lenses. Group G1 includes a first array 162 of parallel first cylindrical micro-lenses 164 each having a longitudinal axis aligned along the Y direction and a back focal length $f_1$. Group G1 further includes a second array 166 of parallel second cylindrical micro-lenses 168 each having a longitudinal axis aligned along the X direction and a back focal length $f_2 < f_1$. Plane back surfaces of the second cylindrical micro-lenses 168 are immediately attached to plane back surfaces of the first cylindrical micro-lenses 164.

Group G2 includes a third array 170 of parallel third cylindrical micro-lenses 172 each having a longitudinal axis aligned along the X direction and a front focal length $f_3 = f_2$. As can be seen best in FIG. 20, the third array 170 is positioned along an optical axis 144 such that curved front surfaces of the third cylindrical micro-lenses 172 face the curved back surfaces of the second cylindrical micro-lenses 168. Furthermore these curved front surfaces of the third cylindrical micro-lenses 172 are at least substantially positioned within the back focal plane of the second cylindrical micro-lenses 168. Since $f_3 = f_2$, the second array 166 is at least substantially positioned in the front focal plane of the third array 170.

Since the focal lines of the second cylindrical micro-lenses 168 are at least approximately on the curved surfaces of the third cylindrical micro-lenses 172, very high light intensities, which may destroy the material of the micro-micro-lenses or a substrate supporting the latter, cannot occur. However, in other embodiments the focal lines of the second cylindrical micro-lenses 168 may be inside the third cylindrical micro-lenses 172, or even inside the fourth cylindrical micro-lenses 176. The optimum relative position between the focal lines of the second cylindrical micro-lenses 168 and the second group G2 is determined by various technical criteria such as the materials of the micro-lenses. For the function of the field defining component 130 it is sufficient that the third cylindrical micro-lenses 172 are at least substantially in the focal plane of the second micro-lenses 168.

Group G2 further includes a fourth array 174 of parallel cylindrical micro-lenses 176 each having a longitudinal axis aligned along the Y direction and a front focal length $f_4 = f_1$. As can be seen best in FIG. 21, the fourth array 174 is positioned along the optical axis 144 such that back surfaces of the cylindrical micro-lenses 176 are at least substantially within the back focal plane of the cylindrical micro-lenses 164 of the first array 162. Again, the focal lines of the first cylindrical micro-lenses 164 may alternatively be positioned inside the fourth cylindrical microlenses 176 or even inside the third cylindrical microlenses 172. Since $f_4 = f_1$, the first array 162 is nevertheless at least substantially positioned in the front focal plane of the fourth array 174. Plane back surfaces of the cylindrical micro-lenses 176 of the fourth array 174 are immediately attached to plane back surfaces of the cylindrical micro-lenses 172 of the third array 170.

Instead of attaching two arrays of micro-lenses, the groups G1, G2 may each be fabricated from single substrates having plane parallel surfaces. The microlenses 164, 168, 172, 176 are then formed on the plane surfaces by molding tools, for example diamonds.

The field defining component 130 further comprises a scattering plate 180 which is arranged in the immediate vicinity of one of the arrays, here behind the fourth array 174. Alternatively, the scattering plate 180 may be positioned in front of the first array 162 or between the groups G1, G2. The scattering plate 180 further enhances the irradiance uniformity in the reticle plane 46.

Figure 22:
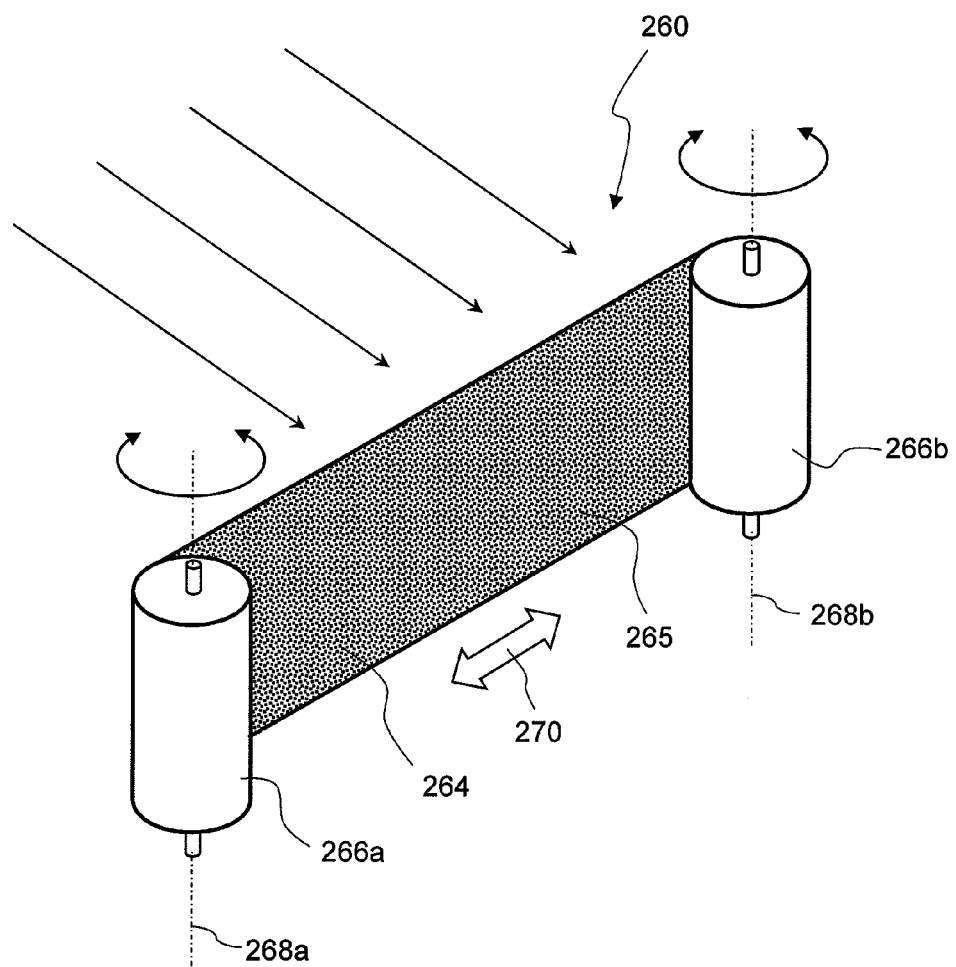
FIG. 22 is a perspective view of a moving scattering foil.

FIG. 22 is a perspective view of a scattering arrangement 260 that may be arranged in front of the field defining element 30 or 130. The scattering arrangement 260 comprises a scattering foil 264 having a scattering structure that is schematically indicated in FIG. 22 by small dots 265. The scattering structure may be realized as an opaque pattern defined on a transparent film, for example. Instead of dots, the scattering structure may comprise a plurality of linear or curved lines forming a Fresnel diffractive optical element, or it may be formed as a computer generated hologram (CGH).

The scattering arrangement 260 further comprises two coils 266a, 266b on which the scattering foil 264 is coiled up similar to the way a film is received and transported in a conventional photo-camera. By rotating the coils 266a, 266b around their longitudinal axes 268a and 268b, respectively, the scattering foil 264 is transported along a direction 270 that is preferably perpendicular to an optical axis of the illumination system.

If the coils 266a, 266b rotate during the exposure operation, the scattering effect produced by the scattering foil 264 is not constant, but "moves" along the direction 270. This reduces possible adverse effects produced by interactions between scattering structures and arrangements comprising regular substructures, such as the field defining component 130 shown in FIGS. 20 and 21.

In the following the nature of these adverse effects will be briefly explained.

Firstly, if there is a combination of a scattering structure having a periodic array of substructures on the one hand and a field defining component having also a plurality of periodic substructures on the other hand, periodic irradiance fluctuations may be observed in the image plane 46 in which the reticle 40 is positioned. These regular irradiance fluctuations are caused by a kind of Moiré pattern which is obtained by combining a periodic scattering structure and a periodic field defining element.

However, even in the case of non-periodic scattering substructures there may be undesired correlations between the latter and the field defining component. This is because at certain (not regular) positions identical configurations of deflecting structures occur that may cause irradiance fluctuations.

Secondly, periodic structures are known to form exact images of themselves at integer multiples of the distance through Fresnel diffraction when illuminated by a coherent or partial coherent wave. This self-imaging phenomenon is commonly referred to as the Talbot effect. In addition, multiple phase-transformed Fresnel images are produced at fractional Talbot distances.

The Talbot effect manifests itself as significant interference patterns having a high contrast at certain distances from the periodic structures. These Talbot distances $z_n$ are given by $z_n = n \cdot Z_T$, where $Z_T = 2p^2/\lambda$. Here $\lambda$ is the wavelength of the incident light, p is the period of the structures and n is a positive integer. However, interference patterns with a smaller contrast are also observed at certain fractional Talbot distances, for example at $\frac{2}{6} Z_T$ or $\frac{3}{14} Z_T$.

Since the Talbot effect is based on diffraction, it is most prominent if the degree of coherence is close to 100%. The illumination light produced by the excimer laser 14 is generally partially coherent. The degree of coherence of the illumination light may be estimated on the basis of the speckle contrast that is present at each point in the illumination system 10. Usually the speckle contrast is in the range between 10% and 20%. This is sufficient for observing prominent Talbot interference patterns at Talbot distances behind any periodic scattering structure.

If the static correlation between a scattering structure and the field defining element is destroyed, both aforementioned effects are suppressed. In the embodiment shown in FIG. 22, this static correlation is destroyed by moving the scattering foil 264 with respect to the field defining component 30 or 130.

If the light source, here the excimer laser 14, produces short light pulses, it should be ensured that the static correlation is destroyed during the duration of each light pulse. Since the light pulses are very short, the movement of the scattering foil 264 should be fast enough to substantially destroy the correlation.

Preferably the scattering foil 264 is constantly moved during a complete exposure cycle. After one or more exposure cycles, the direction of the scattering foil 264 may be reversed.

Figure 23:
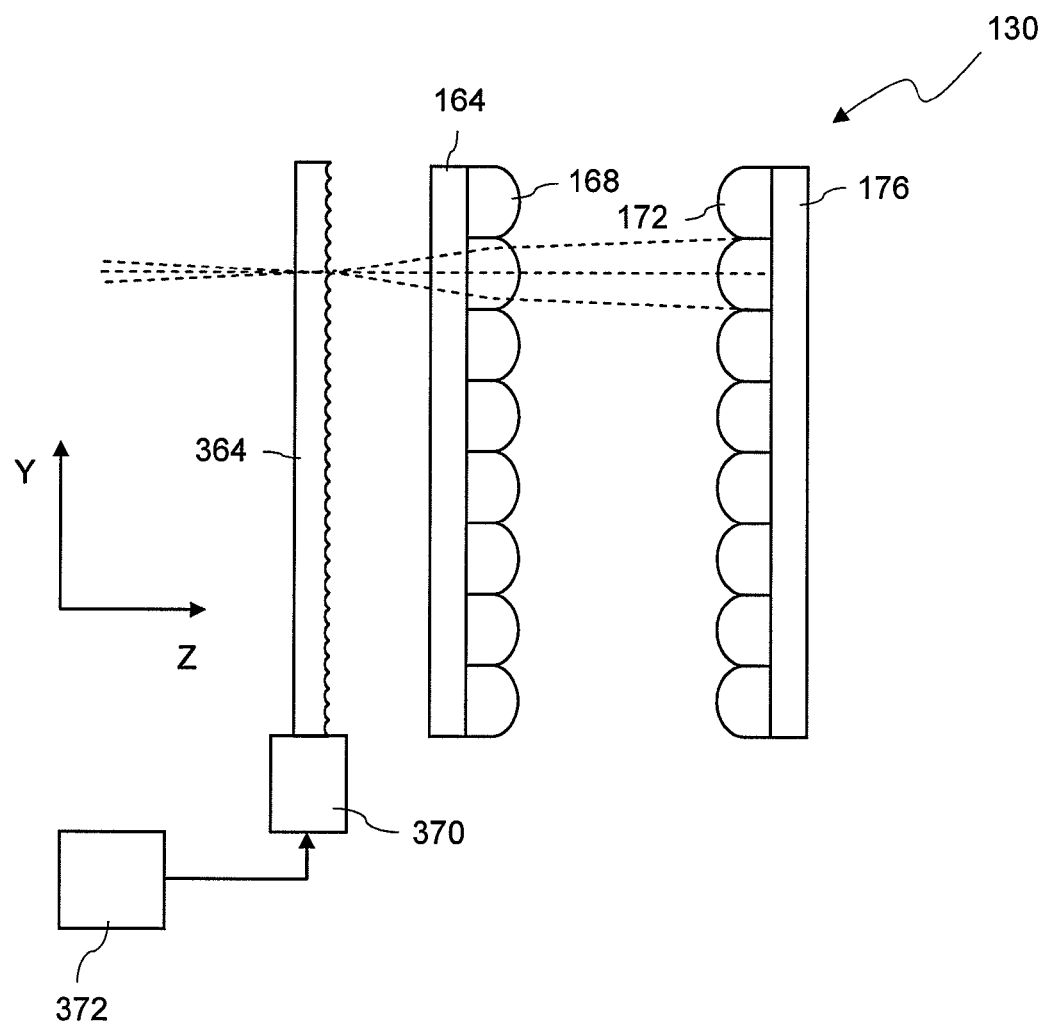
FIG. 23 shows a scattering plate and a field defining component in a representation similar to FIG. 20.

FIG. 23 shows, in a vertical section parallel to the Y-Z plane, the field defining component 130 illustrated in FIGS. 20 and 21 and a scattering plate 364 arranged in front of the field defining component 130, if seen along the light propagation direction. The scattering plate 364, which may be made of $SiO_2$ glass or crystalline $CaF_2$, for example, is connected to a transducer 370 that is configured to produce acoustic waves in the scattering plate 364. Caused by the acousto-optical effect, which is also referred to as Debye-Sears effect, the refractive index of the scattering plate 364 varies rapidly with the frequency of the acoustic waves. As a result, also the scattering effect varies, depending on the frequency, the phase and the amplitudes of the acoustic waves produced in the scattering plate 364 by means of the transducer 370.

Since the acoustic waves propagate in the scattering plate 364 with group velocities as high as 2000 m/s, this embodiment makes it possible to destroy any correlations between the regular features of the scattering plate 364 and the field defining component 130 even within a single light pulse. In this embodiment there are no fast moving components that could cause undesired vibrations in the illumination system.

The transducer 370 is connected to a generator 372 that controls the frequency, phase and amplitude of the acoustic waves. By (quasi-)randomly modulating the frequency and/or phase and/or amplitude of the acoustic waves, it is possible to achieve an additional smearing effect that further prevents any undesired correlation between the scattering plate 58 and the regular features of the field defining component 130.

Figure 24:
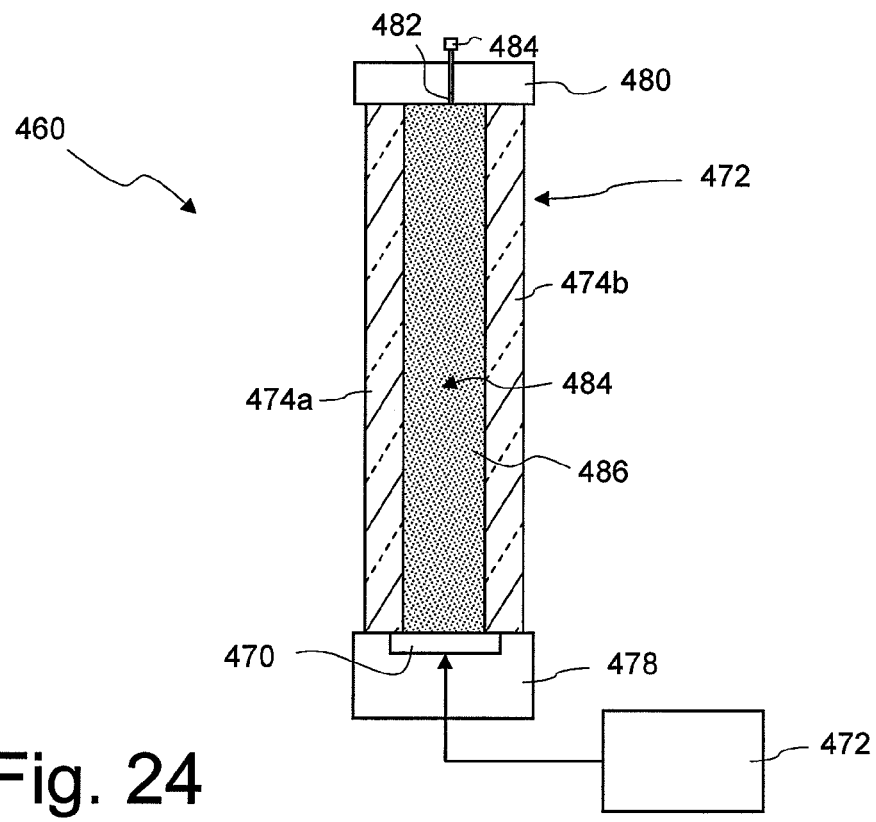
FIG. 24 is a sectional view of a scattering plate formed as a container which is filled with a liquid in which small scattering particles float.

FIG. 24 shows another embodiment of a scattering arrangement in a vertical section which is denoted in its entirety by 460. The scattering arrangement 460 comprises a container 472 having transparent plane-parallel front and rear walls 474a and 474b, respectively, a bottom member 478, and a cover member 480 having an opening 482 for filling the container 472 with a liquid 484. The opening 482 may be sealed using a plug 484.

Small particles 486 float within the liquid 484 that have a scattering effect. Due to the random Brownian particle movements any static correlation between the particles 486 on the one hand and the regular features of the field defining component 130 on the other hand are avoided. The concentration of the particles 486 in the liquid 484 has to be carefully determined in order to obtain the desired scattering effect on the one hand, but keeping light losses as a result of absorption small on the other hand.

The movement of the particles 486 is increased by heat produced in the liquid 484 as a result of light absorption. The heat causes convective movements of the liquid 484 and also increases the speed of the particles 486.

For further increasing the speed of the particles 486, the embodiment shown in FIG. 24 further comprises a transducer 470. The transducer 470 is received in the bottom member 478 and is connected to a generator 472, similar to the embodiment shown in FIG. 23. The transducer 470 produces acoustic waves within the liquid 484 that increase the speed of the particles 486.

Figure 25:
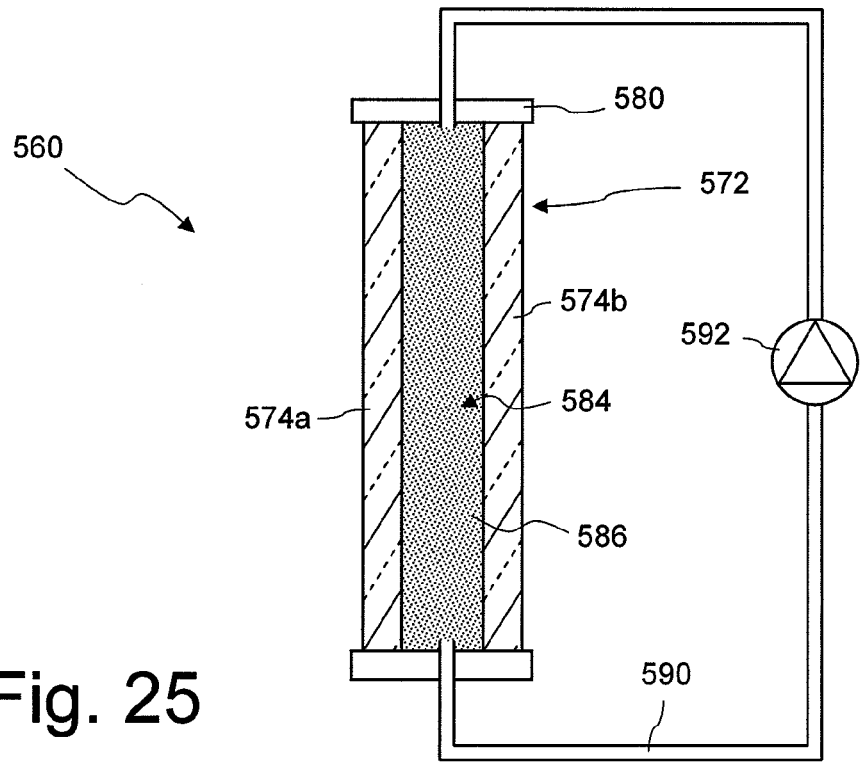
FIG. 25 shows an alternative embodiment of the scattering plate shown in FIG. 24 in which the liquid circulates.

FIG. 25 shows yet another embodiment of a scattering arrangement 560 in a representation similar to FIG. 24. The scattering arrangement 560 differs from the scattering arrangement 460 shown in FIG. 24 in that the transducer 470 and the generator 472 are replaced by a circulation line 590 in which liquid 584 is circulated by means of a pump 592. The microscopic movements of the particles 586 therefore add to the macroscopic movement of the liquid 584 through the container 572 that is laterally confined by the transparent plates 574*a*, 574*b*.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An illumination system for a microlithographic projection exposure step-and-scan apparatus, comprising the following components arranged along a light propagation direction:
    a light source,
    a first optical raster element that extends in or in close proximity of a pupil plane of the illumination system and includes an array of parallel elongated first micro-lenses extending along a first direction which is at least substantially perpendicular to a scan direction of the projection exposure apparatus,
    a second optical raster element that extends in or in close proximity of a second pupil plane of the illumination system, which is not necessarily different from the first pupil plane, and includes an array of parallel elongated second micro-lenses extending along a second direction which is at least substantially parallel to the scan direction,
    a third optical raster element positioned at least substantially in a focal plane of the second micro-lenses and including an array of parallel elongated third micro-lenses that extend along the second direction, said second micro-lenses and third micro-lenses having curved surfaces that are facing each other, and
    a fourth optical raster element positioned at least substantially in a focal plane of the first micro-lenses and including an array of parallel elongated fourth micro-lenses that extend along the first direction.

2. The illumination system of claim 1, wherein the micro-lenses of the optical raster elements have a width of less than 1 mm.

3. The illumination system of claim 1, wherein the distance between the second optical raster element and the third optical raster element is less than 1 mm.

4. The illumination system of claim 3, wherein the distance between the second optical raster element and the third optical raster element is less than 0.5 mm.

5. The illumination system of claim 1, wherein the micro-lenses are cylinder lenses.

6. The illumination system of claim 1, wherein the first optical raster element is attached to the second optical raster element and the third optical raster element is attached to the fourth optical raster element.

7. The illumination system of claim 1, comprising a scattering element that is arranged in or in close proximity of the first or the second pupil plane.

8. The illumination system of claim 1, wherein the illumination system comprises a stop device having two opposing rows of adjacent blades that are arranged parallel to the second direction and can be selectively inserted into an illumination light bundle produced by the light source.

9. A projection exposure apparatus comprising the illumination system of claim 1.

10. A microlithographic method of fabricating a microstructured device, comprising:
    providing a substrate supporting a light sensitive layer;
    providing a reticle containing structures to be imaged onto the light sensitive layer;
    providing the illumination system of claim 1; and
    projecting at least a part of the reticle onto the light sensitive layer by means of a projection lens.

* * * * *